(12) United States Patent
Middleton et al.

(10) Patent No.: US 7,672,141 B2
(45) Date of Patent: Mar. 2, 2010

(54) ALIGNMENT AND SUPPORT APPARATUS FOR COMPONENT AND CARD COUPLING

(75) Inventors: Anthony P. Middleton, Manor, TX (US); Shane Chiasson, Pflugerville, TX (US); George Thomas Holt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 744 days.

(21) Appl. No.: 11/554,123

(22) Filed: Oct. 30, 2006

(65) Prior Publication Data

US 2008/0101051 A1 May 1, 2008

(51) Int. Cl.
*H05K 7/10* (2006.01)
*H01R 12/00* (2006.01)

(52) U.S. Cl. .......................... 361/785; 361/809; 439/59; 439/74; 439/62; 710/301

(58) Field of Classification Search ................. 361/785, 361/809; 439/59, 61, 62, 74, 377; 710/300, 710/301
See application file for complete search history.

(56) References Cited

U.S. PATENT DOCUMENTS

| | | | | |
|---|---|---|---|---|
| 4,840,570 A | * | 6/1989 | Mann et al. .................... | 439/74 |
| 5,251,109 A | * | 10/1993 | Baitz ........................... | 361/796 |
| 5,421,079 A | * | 6/1995 | Cipolla et al. ................. | 29/760 |
| 5,528,460 A | * | 6/1996 | Byrd ........................... | 361/752 |
| 5,576,935 A | * | 11/1996 | Freer et al. .................... | 361/785 |
| 5,726,859 A | * | 3/1998 | Khadem et al. ............. | 361/760 |
| 6,358,079 B1 | * | 3/2002 | Noble ......................... | 439/328 |
| 6,469,474 B2 | | 10/2002 | Bunker | |
| 6,544,061 B1 | * | 4/2003 | Yasufuku et al. ............. | 439/310 |
| 6,850,409 B1 | * | 2/2005 | Triebes et al. .......... | 361/679.32 |
| 7,007,184 B2 | | 2/2006 | Sabotta et al. | |
| 7,103,694 B2 | * | 9/2006 | Schumacher et al. ........ | 710/300 |
| 7,397,671 B2 | * | 7/2008 | Cleveland et al. ........... | 361/756 |
| 7,404,854 B2 | * | 7/2008 | Ganschow et al. .......... | 106/412 |
| 2002/0059492 A1 | * | 5/2002 | Sabotta et al. .............. | 710/301 |
| 2002/0080541 A1 | | 6/2002 | Bunker | |

* cited by examiner

*Primary Examiner*—Dameon E Levi
(74) *Attorney, Agent, or Firm*—Haynes and Boone, LLP

(57) ABSTRACT

A component and card coupling alignment and support apparatus includes a card. A primary component connector is mounted to the card. A primary component including a connection edge engages the primary component connector. A secondary component extends from the primary component. An alignment and support member is included on the secondary component, whereby the card engages the alignment and support member on the secondary component. The engagement of the alignment and support member with the card aligns the primary component with the primary component connector during their coupling and supports the primary component in the primary component connector after their coupling. The card may then be coupled to an information handling system connector in an information handling system.

14 Claims, 9 Drawing Sheets

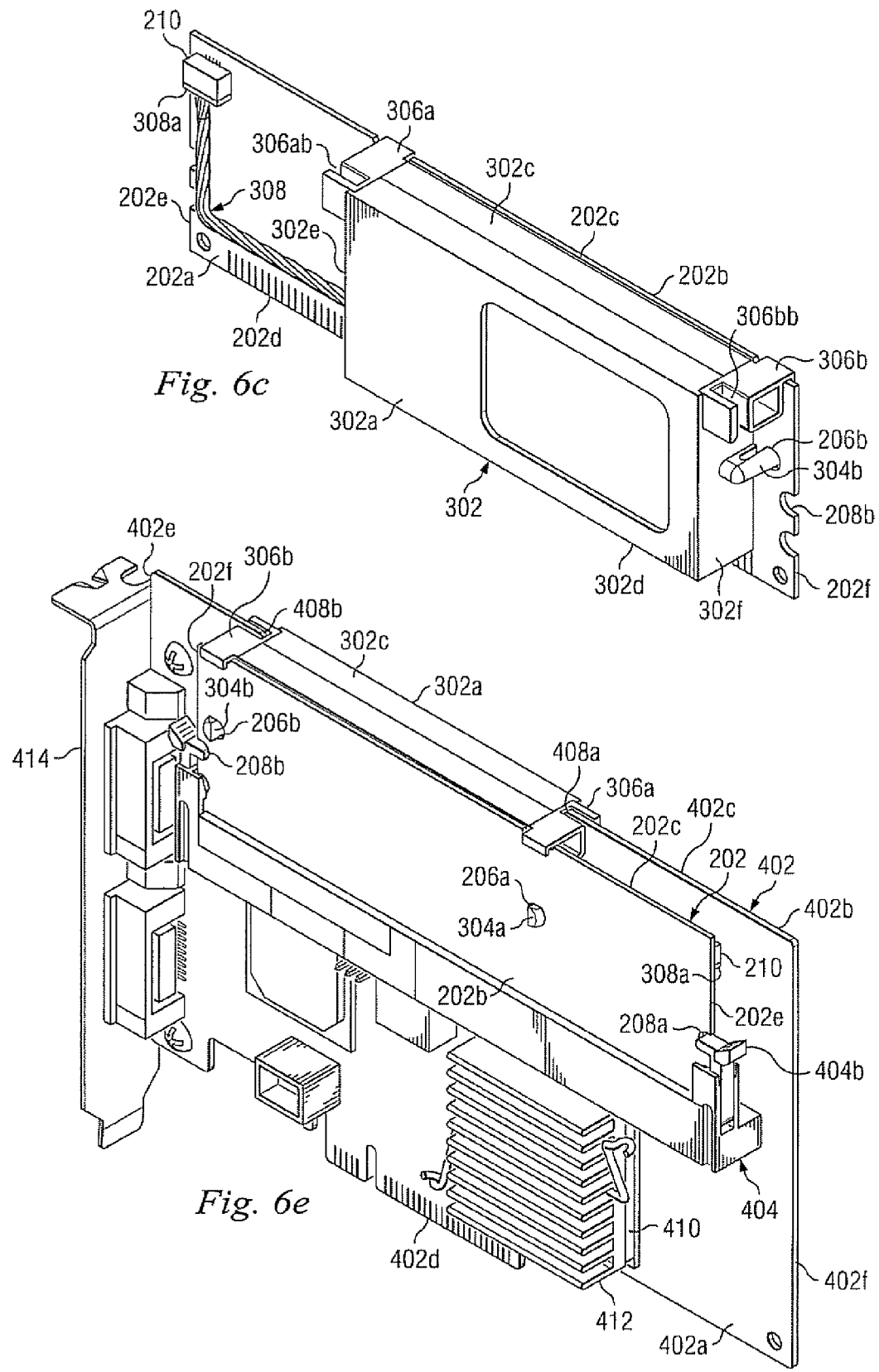

ALIGNMENT AND SUPPORT APPARATUS FOR COMPONENT AND CARD COUPLING

BACKGROUND

The present disclosure relates generally to information handling systems, and more particularly to an alignment and support apparatus for a component and card coupling in an information handling system.

As the value and use of information continues to increase, individuals and businesses seek additional ways to process and store information. One option is an information handling system (IHS). An IHS generally processes, compiles, stores and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs include cards such as, for example, PowerEdge Raid Controller (PERC) cards, that include a processor such as, for example, an Input Output (I/O) processor, that uses a primary component such as, for example, a memory device, that is coupled to a connector on the card. For example, some PERC cards include Dual Inline Memory Module (DIMM) components that connect to a connector on the PERC card that is oriented at a right angle to the surface of the PERC card such that the DIMM component is oriented substantially parallel to the surface of the PERC card. These DIMM components can include a secondary component such as, for example, a battery, that have a mass and volume that greatly exceeds the DIMM component and makes it cumbersome to couple the DIMM component and battery combination to the PERC card. For example, conventional systems provide no means to ensure that the DIMM component and battery combination are aligned with the connector on the PERC card, which can result in damage to the DIMM component and/or the connector and can lead to reliability issues for the entire system. Furthermore, the center of gravity of the DIMM component and battery combination is not in alignment with the connector mating location, which creates a torque on the connector when the DIMM component is coupled to the connector, the stress of which can cause failures in the connector and/or the DIMM component.

Conventional solutions to this include using a screw to secure the DIMM component to the PERC card. This provides support for the DIMM component and battery combination but does not ensure alignment of the DIMM component with the connector on the PERC card. Furthermore, if a user forgets to remove the screw and attempts to use the release features on the connector to remove the DIMM component from the connector, the release features can fail, requiring a new connector for the PERC card.

Accordingly, it would be desirable to provide an alignment and support apparatus for a component and card coupling absent the disadvantages found in the prior methods discussed above.

SUMMARY

A component and card coupling alignment and support apparatus includes a card, a primary component connector mounted to the card, a primary component including a connection edge engaging the primary component connector, a secondary component extending from the primary component, and an alignment and support member on the secondary component, whereby the alignment and support member engages the card to align the primary component with the primary component connector and support the primary component in the primary component connector.

BRIEF DESCRIPTION OF THE DRAWINGS

FIG. 3b is a rear perspective view illustrating an embodiment of the secondary component of FIG. 3a.

FIG. 6c is a perspective view illustrating an embodiment of the secondary component of FIGS. 3a and 3b coupled to the primary component of FIG. 2.

FIG. 6e is a perspective view illustrating an embodiment of the secondary component and the primary component of FIG. 6c coupled to the card of FIG. 4.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various I/O devices, such as a keyboard, a mouse, and a video display. The IHS may also include one or more buses operable to transmit communications between the various hardware components.

Figure 1:
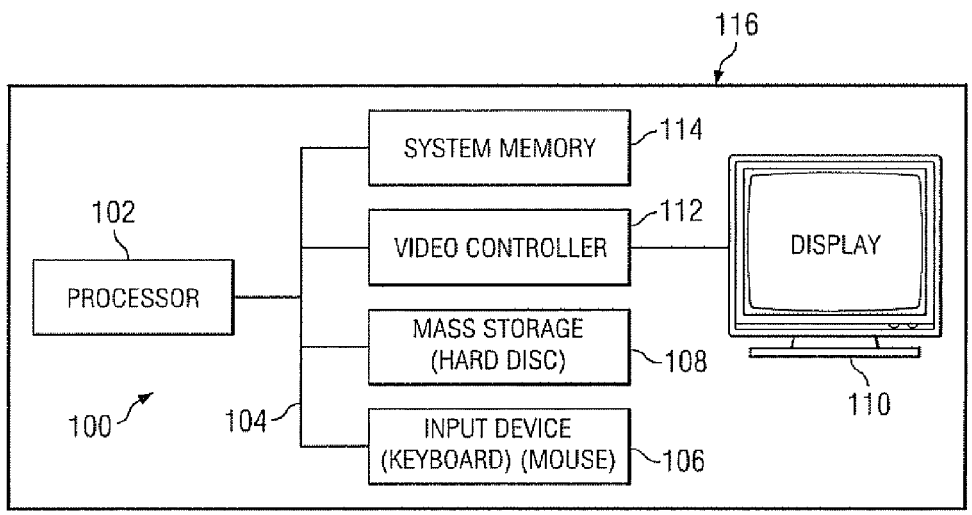
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
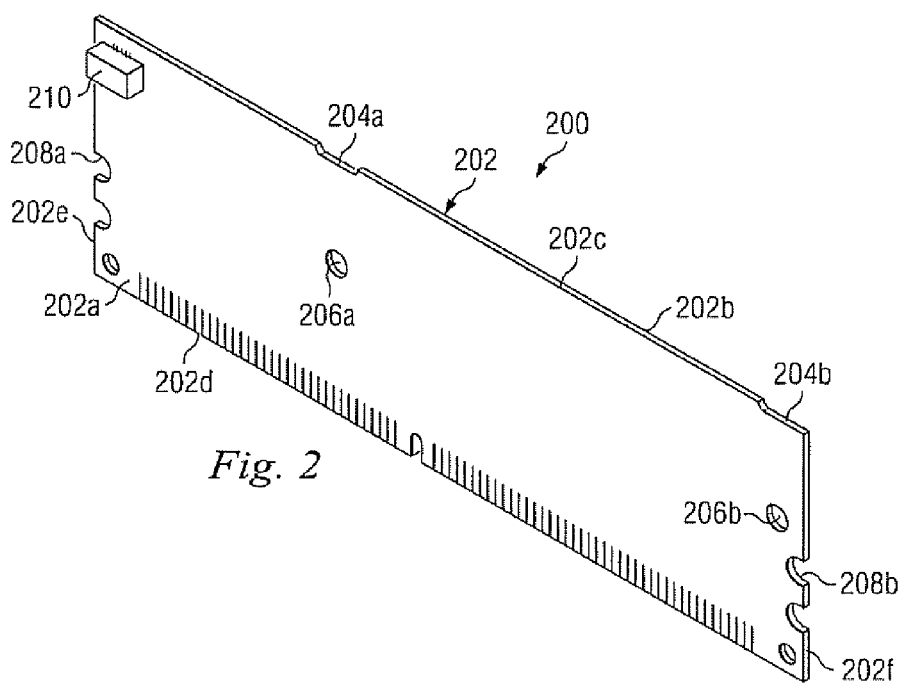
FIG. 2 is a perspective view illustrating an embodiment of a primary component.

Referring now to FIG. 2, a primary component 200 is illustrated. In an embodiment, the primary component 200 is a memory device such as, for example, a DIMM and/or the system memory 114, described above with reference to FIG. 1. The primary component 200 includes a base 202 having a front surface 202a, a rear surface 202b located opposite the front surface 202a, a top edge 202c extending between the front surface 202a and the rear surface 202b, a bottom connection edge 202d located opposite the top edge 202c and extending between the front surface 202a and the rear surface 202b, and a pair of opposing side edges 202e and 202f extending between the front surface 202a, the rear surface 202b, the top edge 202c, and the bottom connection edge 202d. A pair of secondary component coupling channels 204a and 204b are defined by the base 202 and located on the top edge 202c of the base 202 in a spaced apart orientation. A pair of secondary component coupling apertures 206a and 206b are defined by the base 202 and extend through the base 202 from the front surface 202a to the rear surface 202b in a spaced apart orientation from each other. A connector coupling channel 208a is defined by the base 202 and located on the side edge 202e of the base 202 substantially midway between the top edge 202c and the bottom connection edge 202d. A connector coupling channel 208b is defined by the base 202, located on the side edge 202f of the base 202 opposite the connector channel 208a and substantially midway between the top edge 202c and the bottom connection edge 202d. A electrical connector 210 extends from the front surface 202a of the base 202, is located adjacent the top edge 202c and the side edge 202e, and may be electrically coupled to components on the primary component 200 (which have been omitted for clarity.)

Figure 3A:
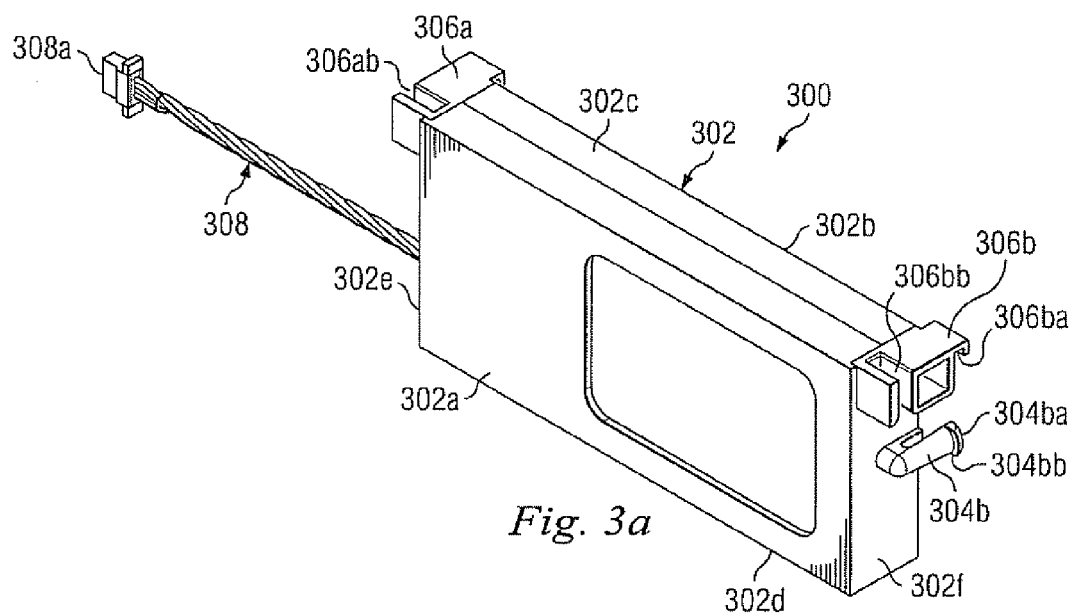
FIG. 3a is a front perspective view illustrating an embodiment of a secondary component used with primary component of FIG. 2.
Figure 3B:
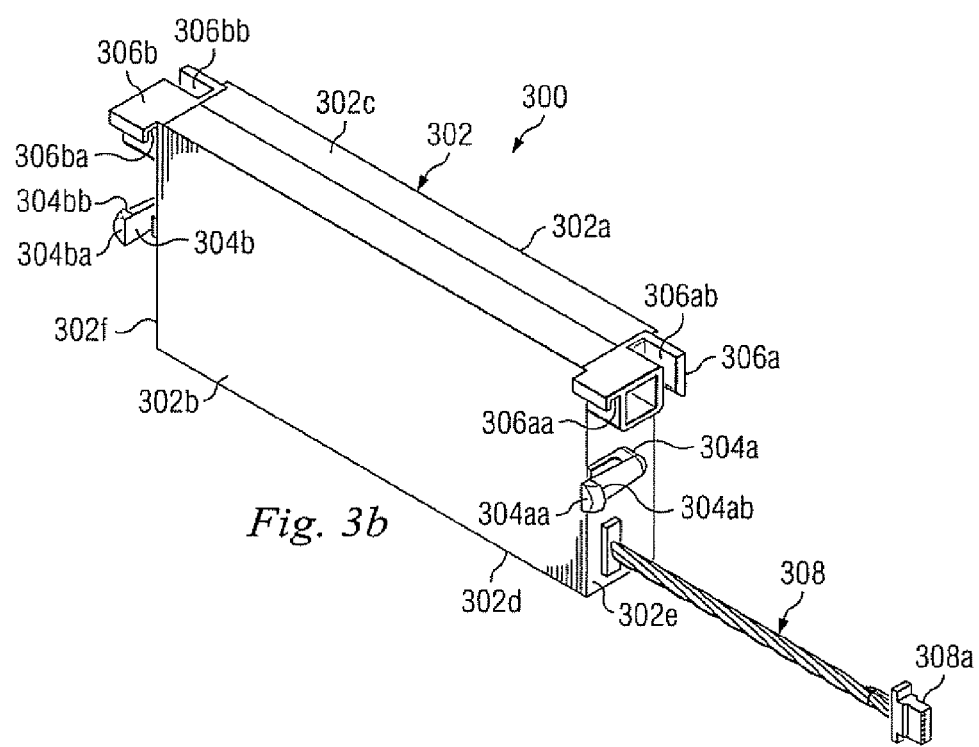

Referring now to FIGS. 3a and 3b, a secondary component 300 is illustrated. In an embodiment, the secondary component 300 is a battery such as, for example, a Transportable Battery Back Up (TBBU) for a DIMM, as illustrated. However, in an alternative embodiment, the secondary component 300 may be a heat sink, a fan, and/or a variety of other secondary components known in the art. The secondary component 300 includes a base 302 having a front surface 302a, a rear surface 302b located opposite the front surface 302a, a top surface 302c extending between the front surface 302a and the rear surface 302b, a bottom surface 302d located opposite the top surface 302c and extending between the front surface 302a and the rear surface 302b, and a pair of opposing side surfaces 302e and 302f extending between the front surface 302a, the rear surface 302b, the top surface 302c, and the bottom surface 302d. A coupling member 304a extends from the side surface 302e of the base 302 and includes a beveled surface 304aa and a securing surface 304ab located adjacent the beveled surface 304aa. A coupling member 304b extends from the side surface 302f of the base 302 opposite the coupling member 304a and includes a beveled surface 304ba and a securing surface 304bb located adjacent the beveled surface 304ba. An alignment and support member 306a extends from the side surface 302e of the base 302 adjacent the top surface 302c and defines a primary component coupling channel 306aa located adjacent the rear surface 302b of the base 302 and an alignment and support channel 306ab extending substantially perpendicular to the side surface 302e. An alignment and support member 306b extends from the side surface 302f of the base 302 adjacent the top surface 302c and defines a primary component coupling channel 306ba located adjacent the rear surface 302b of the base 302 and an alignment and support channel 306bb extending substantially perpendicular to the side surface 302f. The coupling member 304a and primary component coupling channel 306aa combination and the coupling member 306a and primary component coupling channel 306ba provide a pair of coupling features on the secondary component 300 operable to couple the secondary component 300 to the primary component 200, described in further detail below. A cable 308 extends from the side surface 302e of the base 302 and includes a plug 308a on its distal end.

Figure 4:
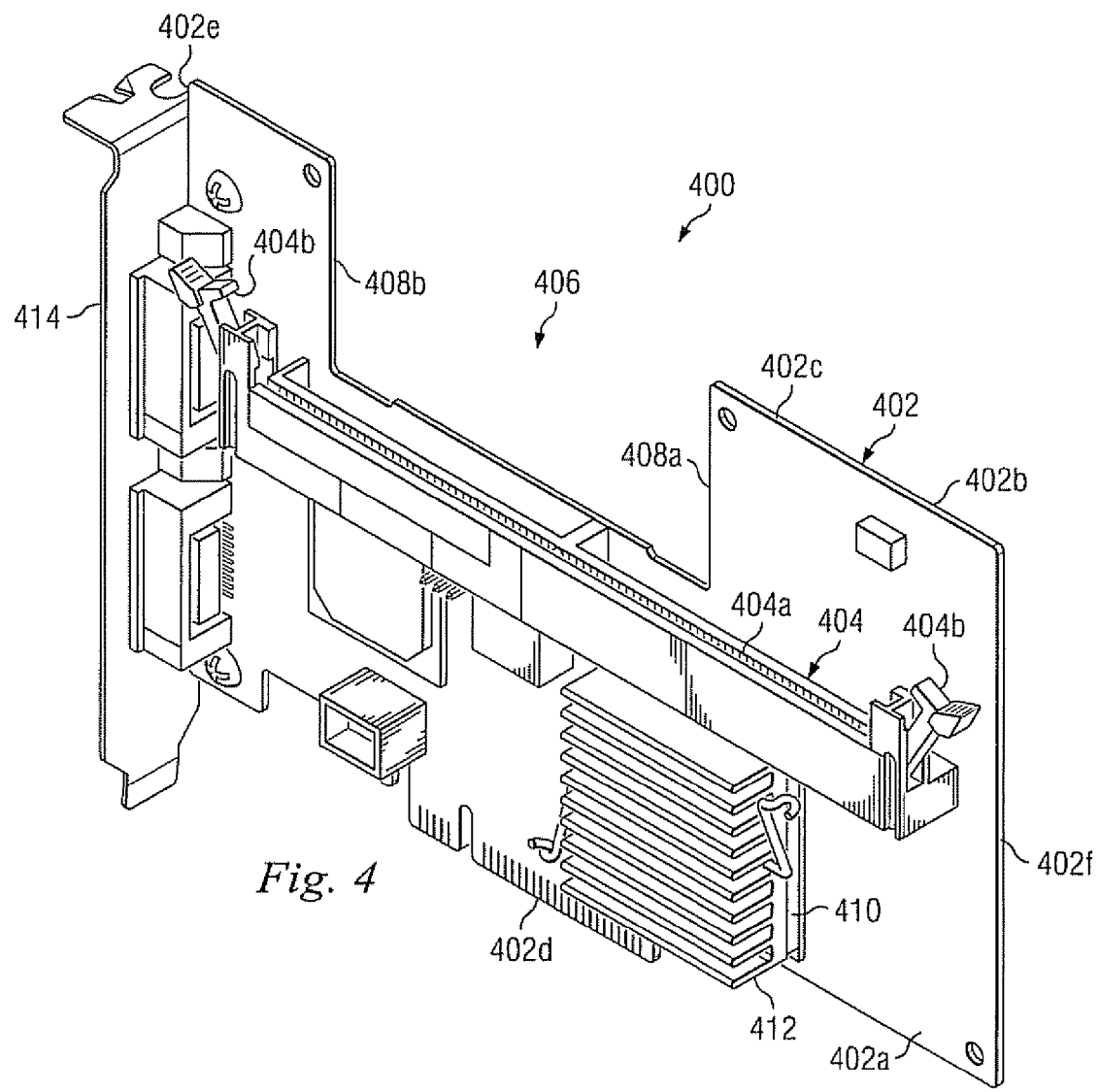
FIG. 4 is a perspective view illustrating an embodiment of a card used with the primary component of FIG. 2 and the secondary component of FIGS. 3a and 3b.

Referring now to FIG. 4, a card 400 is illustrated. In an embodiment, the card 400 may be a PERC card, a graphics card, and/or a variety of other cards known in the art. The card 400 includes a base 402 having a front surface 402a, a rear surface 402b located opposite the front surface 402a, a top edge 402c extending between the front surface 402a and the rear surface 402b, a bottom IHS connection edge 402d located opposite the top edge 402c and extending between the front surface 402a and the rear surface 402b, and a pair of opposing side edges 402e and 402f extending between the front surface 402a, the rear surface 402b, the top edge 402c, and the bottom IHS connection edge 402d. A primary component connector 404 extends from the front surface 402a of the card 400 approximately midway between and substantially parallel to the top edge 402c and the bottom IHS connection edge 402d of the base 402. In an embodiment, the primary component connector 404 may be, for example, a Joint Electron Device Engineering Council (JEDEC) form factor connector. A connection channel 404a is defined by the primary component connector 404 and is located along the length of the primary component connector 404. A pair of coupling members 404b are located on opposite ends of the primary component connector 404 and moveably coupled to the primary component connector 404. A secondary component channel 406 is defined by the base 402 and extends from the top edge 402c of the base 402 to a location adjacent the connector 404. A pair of alignment and support edges 408a and 408b are located on the base 402 on opposite sides of the secondary component channel 406 and help define the secondary component channel 406. A card processor 410 is mounted to the front surface 402a of the card 402 and is electrically coupled to the primary component connector 404.

A heat sink 414 is coupled to the card processor 410. An IHS coupling member 414 extends from the side edge 402e of the base 402.

Figure 5:
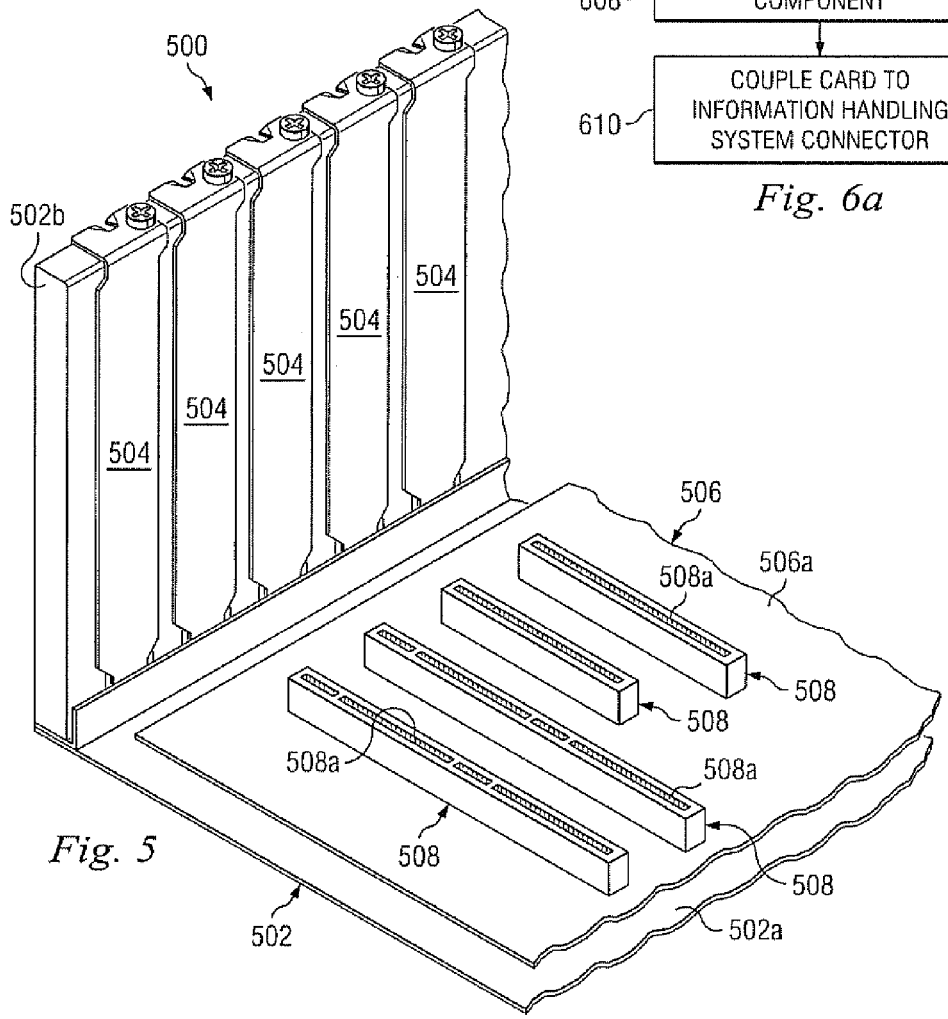
FIG. 5 is a perspective view illustrating an embodiment of an IHS chassis used with the primary component of FIG. 2, the secondary component of FIGS. 3a and 3b, and the card of FIG. 4.

Referring now to FIG. 5, an IHS chassis 500 is illustrated. In an embodiment, the IHS chassis 500 is the chassis 116 which houses some or all of the components of the IHS 100, described above with reference to FIG. 1. The IHS chassis 500 includes a base 502 having a bottom wall 502a and a side wall 502b oriented substantially perpendicularly to the bottom wall 502a. A plurality of card coupling sections 504 are located adjacent each other on the side wall 502b of the base 502 in a substantially parallel and spaced apart orientation. A board 506 is coupled to the IHS chassis 500, is oriented substantially parallel to the bottom wall 502a of the base 502, and includes a top surface 506a. A plurality of card connectors 508, each defining a card channel 508a along its length, are mounted to the top surface 506a of the board 506 and are located adjacent respective card coupling sections 504 on the side wall 502b. In an embodiment, a board processor such as, for example, the processor 102 described above with reference to FIG. 1, is mounted to the board 508 and electrically coupled to the connectors 508.

Figure 6A:
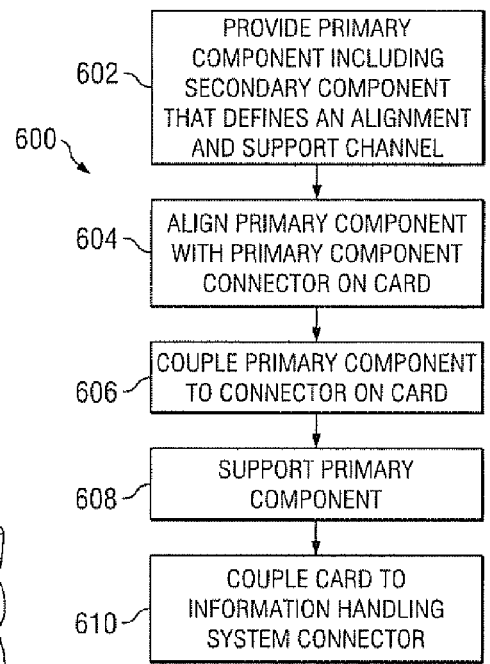
FIG. 6a is a flow chart illustrating an embodiment of a method for aligning and supporting a component on a card.
Figure 6B:
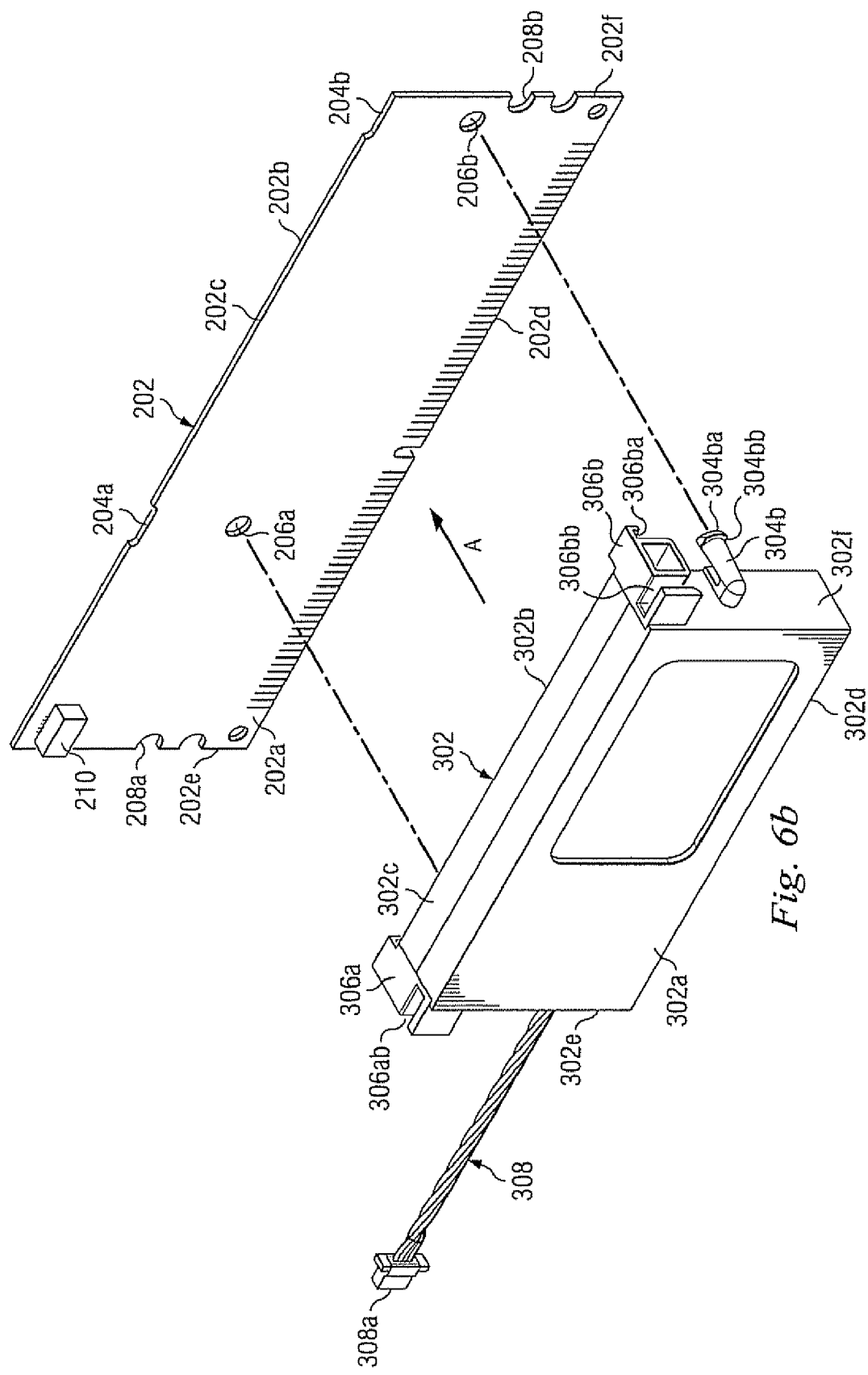
FIG. 6b is a perspective view illustrating an embodiment of the secondary component of FIGS. 3a and 3b being coupled to the primary component of FIG. 2.
Figure 6D:
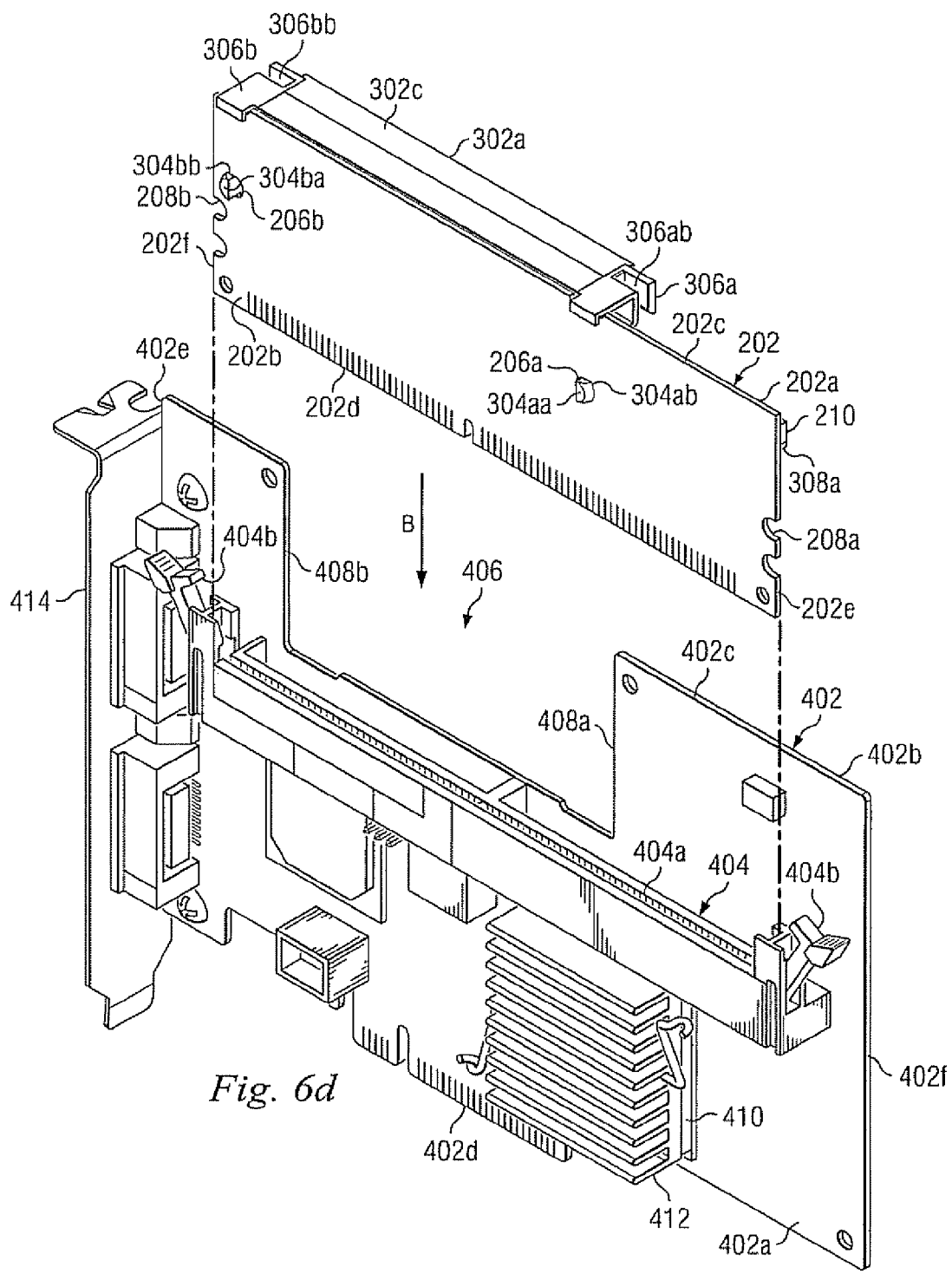
FIG. 6d is a perspective view illustrating an embodiment of the secondary component and the primary component of FIG. 6c being coupled to the card of FIG. 4.

Referring now to FIGS. 2, 3a, 3b, 6a, 6b and 6c, a method 600 for aligning and supporting a component on a card is illustrated. The method 600 begins at step 602 where a primary component including a secondary component that defines an alignment and support channel is provided. The primary component 200, described above with reference to FIG. 2, is provided. The secondary component 300, described above with reference to FIGS. 3a and 3b, is then positioned adjacent the primary component 200 such that rear surface 302b of the secondary component 300 is located adjacent the front surface 202a of the primary component 200, the coupling members 304a and 304b on the secondary component 300 are aligned with the secondary component coupling apertures 206a and 206b, respectively, defined by the primary component 200, and the alignment and support members 306a and 306b on the secondary component 300 are aligned with the secondary component coupling channels 204a and 204b, respectively, on the primary component 200, as illustrated in FIG. 6b. The secondary component 300 is then moved in a direction A such that the top edge 202c of the primary component 200 that defines the secondary component coupling channels 204a and 204b becomes located in the primary component coupling channels 306aa and 306ba, respectively, defined by the alignment and support members 306a and 306b, respectively. Movement of the secondary component 300 in the direction A also results in the beveled surfaces 304aa and 304ba on the coupling members 304a and 304b, respectively, engaging the base 202 adjacent the secondary component coupling apertures 206a and 206b, respectively, such that the coupling members 304a and 304b deflect into the secondary component coupling apertures 206a and 206b, respectively, until the securing surfaces 304ab and 304bb on the coupling members 304a and 304b, respectively, engage the rear surface 202b on the primary component 200 and couple the secondary component 300 to the primary component 200, as illustrated in FIG. 6c. The plug 308a on the cable 308 that extends from the secondary component 300 is then engaged with the electrical connector 210 that extends from the front surface 202a of the primary component 200. While the secondary component 300 has been shown being coupled to the primary component 200, in an alternative embodiment, the secondary component 300 may be fabricated as part of the primary component 200 and be an integral part of the primary component 200 such that it extends from the primary component 200 and cannot be decoupled from the primary component 200.

Referring now to FIGS. 2, 3a, 3b, 4, 6a, 6c, 6d and 6e, the method 600 then proceeds to step 604 where the primary component is aligned with the primary component connector on the card. The primary component 200 and secondary component 300 combination are positioned adjacent the card 400, described above with reference to FIG. 4, such that the bottom connector edge 202d of the primary component 200 is located adjacent the top edge 402c of the card 400 with the secondary component 300 substantially aligned with the secondary component channel 406 defined by the card 400. The primary component 200 and secondary component 300 combination are then moved in a direction B such that the alignment and support edges 408a and 408b on the card 400 become positioned in the primary component coupling channels 306aa and 306ba, respectively, defined by the alignment and support members 306a and 306b, respectively. The positioning of the alignment and support edges 408a and 408b in the primary component coupling channels 306aa and 306ba, respectively, aligns the bottom connector edge 202d of the primary component 200 with the connection channel 404a defined by the primary component connector 404 such that the bottom connector edge 202d and the primary component connector 404 are not damaged during the coupling of the primary component 200 with the primary component connector 404. The method 600 then proceeds to step 606 where the primary component is connected to the primary component connector on the card. The continued movement in the direction B of the primary component 200 and secondary component 300 combination results in the bottom connection edge 202d engaging the connection channel 404a defined by the primary component connector 404 and electrically coupling the primary component 200 to the processor 410 on the card 400, as illustrated in FIG. 6e. In an embodiment, the secondary component 300 and/or the secondary component channel 406 are dimensioned such that the bottom surface 302d of the secondary component 300 engages the edge of the secondary component channel 206 that is adjacent the primary component connector 404 such that the primary component 200 may be coupled to the primary component connector 404 but it may not overstress the primary component connector 404 during coupling. The method 600 then proceeds to step 608 where the primary component is supported. With the primary component 200 coupled to the primary component connector 400, the positioning of the alignment and support edges 408sa and 408b on the card 400 in the alignment and support channels 306ab and 306bb, respectively, on the alignment and support members 306a and 306b, respectively, prevents the top edge 202c of the primary component 200 from moving relative to the primary component connector 404 such that the primary component is flexed or torqued, which provides support for the primary component 200 and limits damage to the primary component 200 and the primary component connector 404.

Figure 6F:
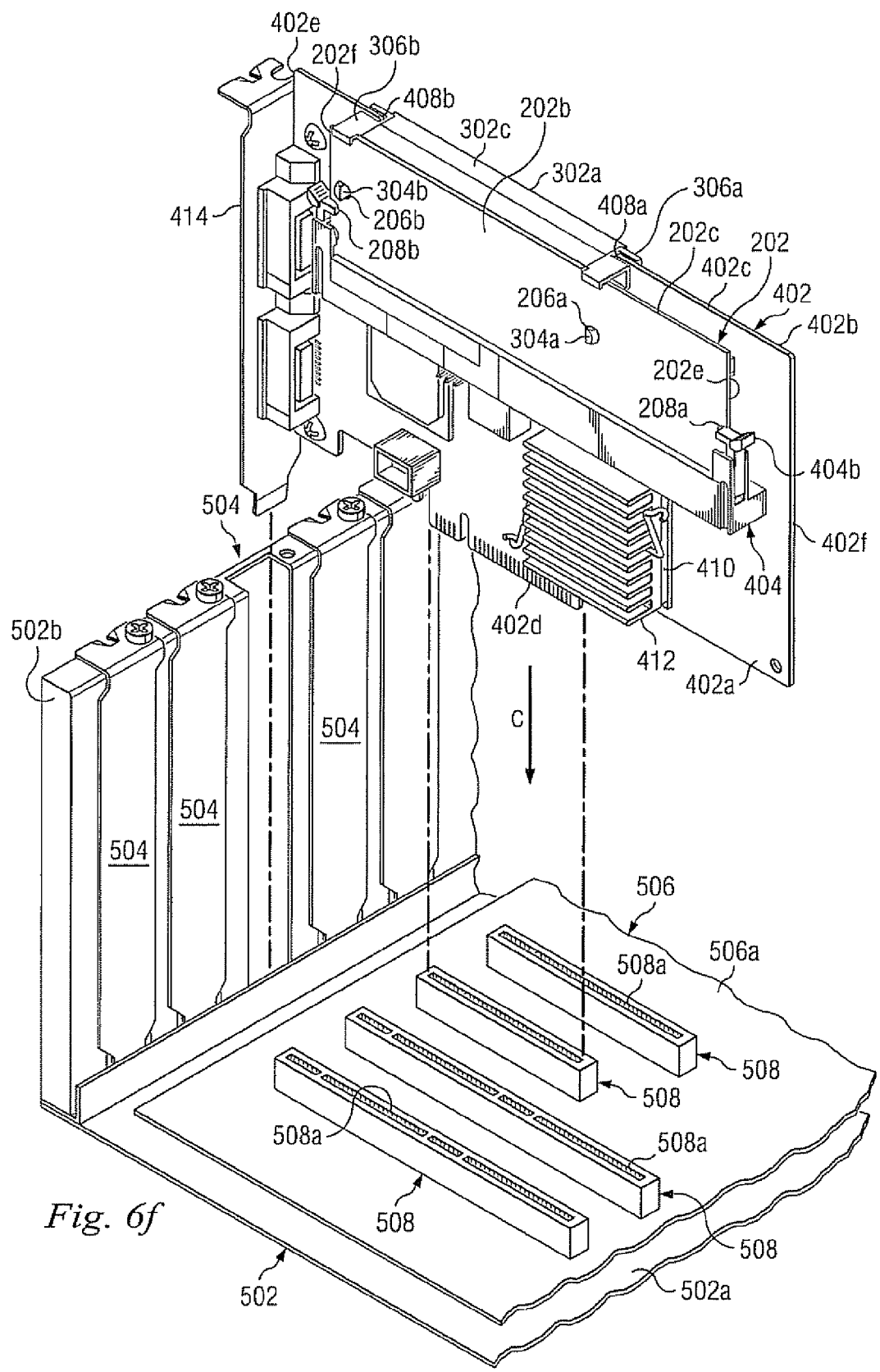
FIG. 6f is a perspective view illustrating an embodiment of the secondary component, the primary component, and the card of FIG. 6e being coupled to the IHS chassis of FIG. 5.
Figure 6G:
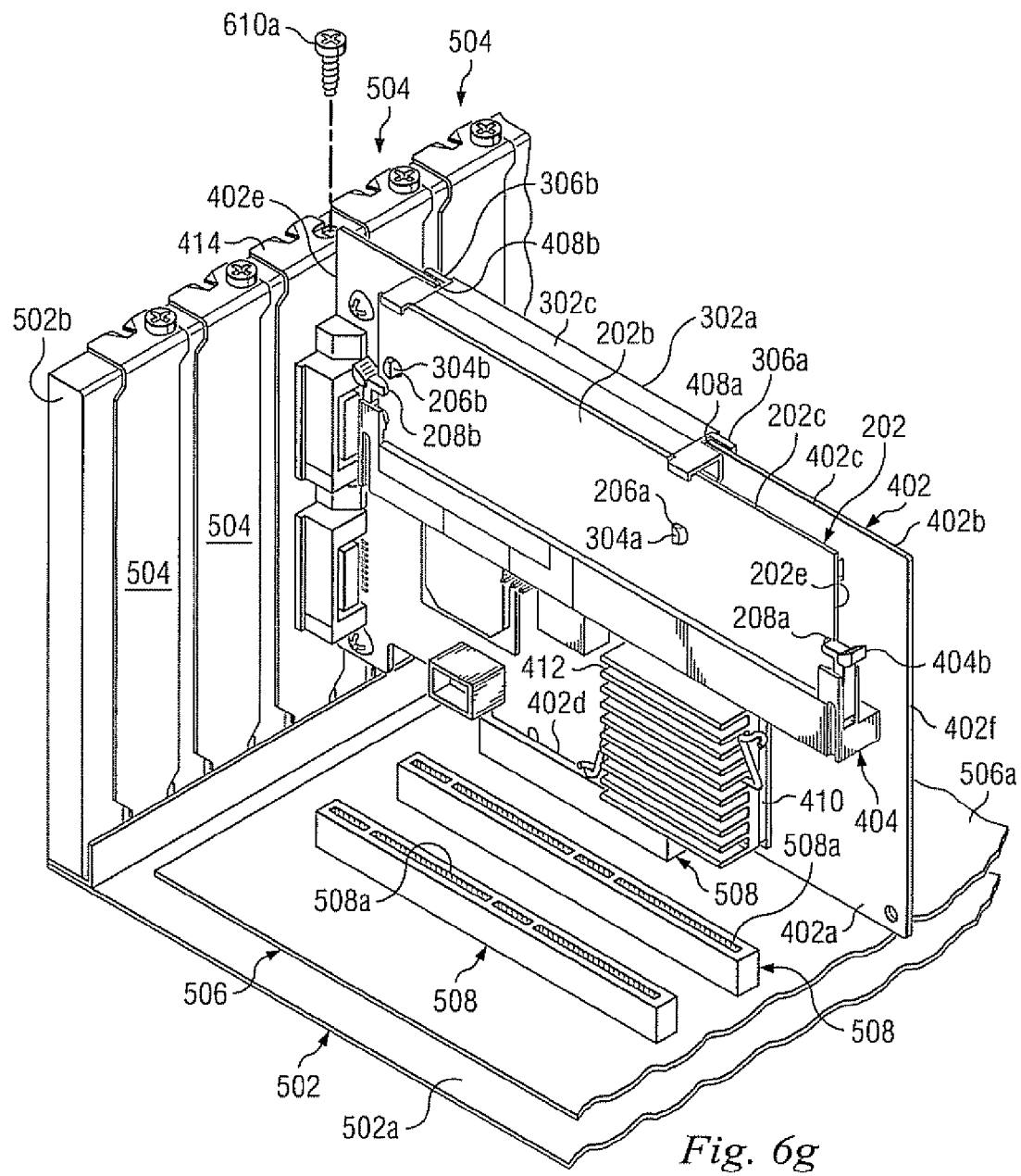
FIG. 6g is a perspective view illustrating an embodiment of the secondary component, the primary component, and the card of FIG. 6e coupled to the IHS chassis of FIG. 5.

Referring now to FIGS. 2, 3a, 3b, 4, 4, 6a, 6e, 6f and 6g, the method 600 then proceeds to step 610 where the card is coupled to an IHS connector. The card 400 including the primary component 200 and the secondary component 300 is positioned adjacent the IHS chassis 500, described above with reference to FIG. 5, such that the IHS coupling member 414 on the card 400 engages one of the card coupling sections 504 on the side wall 502b of the IHS chassis 500 and the bottom IHS connection edge 402d is aligned with one of the card channels 508a on one of the card connectors 508, as illustrated in FIG. 6f. The card 400 is then moved in a direction C such that the bottom IHS connection edge 402d engages the card channel 508a on the card connector 508, coupling the card to the board 506. A fastener 610a such as, for example, a threaded fastener, may be used to engage the IHS coupling member 414 and the card coupling section 504 on the side wall 502b of the IHS chassis 500 in order to secure the card 400 in the IHS chassis 500, as illustrated in FIG. 6g. Thus, a method and apparatus are provided which allow a primary component to be aligned with a card in order to ensure the proper mating of the primary component with a connector on the card and then supported on the card to limit damage of the connector or the primary component once the primary component is coupled to the card.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component and card coupling alignment and support apparatus, comprising:
   a board having a first connector mounted therein;
   a card mounted in the first connector and having a second connector mounted thereon and a channel formed therein;
   a primary component mounted in the second connector and having a coupling aperture formed therein;
   a secondary component having a first coupling member extending into engagement with the coupling aperture, the secondary component mounted in the channel; and
   a second coupling member on the second connector releasably engaged with the primary component.

2. The apparatus of claim 1, wherein the primary component is a memory device.

3. The apparatus of claim 1, wherein the secondary component is a battery.

4. The apparatus of claim 1, wherein the primary component is oriented substantially parallel to a surface of the card.

5. The apparatus of claim 1, further comprising:
   a processor mounted to the card and electrically coupled to the primary component through the second connector.

6. The apparatus of claim 1, further comprising:
   an information handling system connection edge located on the card.

7. The apparatus of claim 1, further comprising:
   a cable extending between the primary component and the secondary component and electrically coupling the primary component to the secondary component.

8. An information handling system, comprising:
   a board having a processor and a first connector mounted thereon;
   a card mounted in the first connector and having a second connector mounted thereon and a channel formed therein;
   a primary component mounted in the second connector and having a coupling aperture formed therein;
   a secondary component having a first coupling member extending into engagement with the coupling aperture, the secondary component mounted in the channel; and
   a second coupling member on the second connector releasably engaged with the primary component.

9. The system of claim 8, wherein the primary component is a memory device.

10. The system of claim 8, wherein the secondary component is a battery.

11. The system of claim 8, wherein the primary component is oriented substantially parallel to a surface of the card.

12. The system of claim 8, wherein the
   processor is electrically coupled to the primary component through the primary component connector.

13. The system of claim 8, further comprising:
   an information handling system connection edge located on the card and engaging the card connector to electrically couple the card to the processor.

14. The system of claim 8, further comprising:
   a cable extending between the primary component and the secondary component and electrically coupling the primary component to the secondary component.

* * * * *